(12) United States Patent
Katsumata et al.

(10) Patent No.: US 7,812,444 B2
(45) Date of Patent: Oct. 12, 2010

(54) SEMICONDUCTOR IC-EMBEDDED MODULE WITH MULTILAYER SUBSTRATES WITH MULTIPLE CHIPS EMBEDDED THEREIN

(75) Inventors: Masashi Katsumata, Tokyo (JP);
Kenichi Kawabata, Tokyo (JP);
Toshikazu Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 125 days.

(21) Appl. No.: 11/521,156

(22) Filed: Sep. 14, 2006

(65) Prior Publication Data

US 2007/0057366 A1    Mar. 15, 2007

(30) Foreign Application Priority Data

Sep. 14, 2005  (JP)  ............... 2005-266345

(51) Int. Cl.
*H01L 23/34* (2006.01)
(52) U.S. Cl. .................. 257/723; 257/207; 257/691; 257/E23.175; 257/E25.012
(58) Field of Classification Search ............ 257/691, 257/723, E23.175, E25.012, 207
See application file for complete search history.

(56) References Cited

U.S. PATENT DOCUMENTS

| 2002/0117743 A1* | 8/2002 | Nakatani et al. ............ 257/687 |
| 2002/0176236 A1* | 11/2002 | Iguchi et al. ................ 361/753 |
| 2003/0090883 A1 | 5/2003 | Asahi et al. ................ 361/761 |
| 2004/0061147 A1* | 4/2004 | Fujita et al. ................. 257/232 |
| 2004/0202848 A1* | 10/2004 | Takaya et al. ............... 428/209 |
| 2006/0001152 A1* | 1/2006 | Hu .............................. 257/707 |

FOREIGN PATENT DOCUMENTS

| CN | 1418048 A | 5/2003 |
| JP | H01-175297 | 7/1989 |
| JP | H04-294567 | 10/1992 |
| JP | H07-240584 | 9/1995 |
| JP | 2000-031207 | 1/2000 |
| JP | 2000-183536 | 6/2000 |
| JP | 2000-183540 | 6/2000 |
| JP | 2001-102517 | 4/2001 |
| JP | 2004-343021 | 12/2004 |
| TW | 229433 B | 3/2005 |

* cited by examiner

*Primary Examiner*—Hung Vu
*Assistant Examiner*—Vernon P Webb
(74) *Attorney, Agent, or Firm*—Kevin A. Wolff; Wolff Law Offices, PLLC

(57) ABSTRACT

A semiconductor IC-embedded module 100 comprises a multilayer substrate 101 having first and second insulating layers 101a and 101b, and a controller IC 012 and memory IC 103 that are embedded in the multilayer substrate 101. A wiring layer 104 is formed as an internal layer in the multilayer substrate 101. Part of the wiring layer 104 constitutes a bus line 104X. The controller IC 102 or memory IC 103 is embedded in the second insulating layer 101b. First and second ground layers 105a and 105b are provided respectively in the first and second insulating layers 101a and 101b. The effect of noise generated by bus lines is reduced, and an additional reduction in noise and a decrease in size and thickness are achieved by laying out bus lines that connect the semiconductor ICs so that distances are minimized.

20 Claims, 9 Drawing Sheets

SEMICONDUCTOR IC-EMBEDDED MODULE WITH MULTILAYER SUBSTRATES WITH MULTIPLE CHIPS EMBEDDED THEREIN

TECHNICAL FIELD

The present invention relates to a semiconductor IC-embedded module, and particularly relates to a semiconductor IC-embedded module having ground layers on both surfaces of a substrate in which a semiconductor IC has been embedded.

BACKGROUND OF THE INVENTION

Conventional semiconductor IC-embedded modules are known which have structures in which the semiconductor IC chip is disposed by layering in the vertical direction on a multilayered substrate (refer to Japanese Laid-open Patent Application No. 2001-102517). With these modules, thick insulating resin layers that are thicker than the bare chip are formed on both sides of the multilayer substrate, and the bare chip is thus embedded therein. Wiring layers are provided on both sides of these insulating resin layers, and the wiring layer on the surface side is used as the ground layer, whereas the wiring layer on the internal layer side is used for the power lines. Connection between semiconductor ICs is achieved through via holes and wiring layers that are formed as internal layers and surface layers of the multilayer substrate.

With the aforementioned type of conventional semiconductor IC-embedded module, a semiconductor IC chip is embedded inside an insulating resin layer formed on the surface of the multilayer substrate, and because this type of semiconductor IC is connected with a ground layer and power line provided on both sides thereof, it is possible to shorten the wiring distance for the ground layer and power lines, thereby providing a circuit device with excellent electrical characteristics.

There are various other inventions in the prior art related to the present invention (Refer to Japanese Laid-open Patent Application Nos. 2000-183540 and 2000-31207).

However, a problem with the aforementioned type of conventional semiconductor IC-embedded module is that the substrate as a whole becomes extremely thick because the substrate has a built-up configuration. Moreover, because via holes are used for connections between semiconductor ICs, a large amount of space is required for connecting the semiconductor ICs, and there are problems with increasing wiring distances. The increased wiring distances also tend to bring about impedance mismatching and noise generation. In particular, the bus lines that connect controller ICs and memory ICs operate at high clock speeds of about 100 MHz, so that unwanted high-frequency radiation is produced as the wiring distances increase, leading to problems with detrimental effects on the analog circuits of wireless systems.

SUMMARY OF THE INVENTION

It is therefore an object of the present invention to provide a semiconductor IC-embedded module whereby noise effects resulting from bus lines can be reduced, and whereby bus lines for connecting semiconductor ICs can be disposed at minimum distances, thereby allowing further reduction in device size and thickness, as well as noise.

The above and other objects of the present invention can be accomplished by a semiconductor IC-embedded module comprising a multilayer substrate on which a plurality of insulating layers are layered; first and second semiconductor IC chips implanted into the multilayer substrate so as to be arranged in a mutually horizontal configuration; and a bus line for connecting the first and second semiconductor IC chips. By means of the present invention, the two semiconductor IC chips are embedded in a multilayer substrate, making it possible to form a bus line for connecting the two at a minimum distance.

In the present invention, the multilayer substrate preferably includes first and second insulating layers, and the bus line preferably is provided between the first and second insulating layers. In addition, both the first and second semiconductor IC chips are preferably embedded in one layer selected from the aforementioned first and second insulating layers. Moreover, the multilayer substrate preferably also has first and second conductive layers that cover the top and bottom of the bus line. In this case, the first conductive layer is preferably provided on the surface of the first insulating layer that is opposite the second insulating layer, and the second conductive layer is provided on the surface of the second insulating layer that is opposite the first insulating layer. By this means, it is possible to provide a semiconductor IC-embedded module having simple structure with a small size and thickness.

In the present invention, the first and second conductive layers may both be ground layers, or one of the first and second conductive layers may be a power layer and the other may be a ground layer, and a bypass capacitor may be provided between the power layer and ground layer. When the conductive layer is a power layer and a bypass capacitor is interposed between the power layer and ground layer, the power layer may be viewed as a ground layer in consideration of the alternating current. In both cases, it is possible to reduce noise due to shielding effect of the conductive layers.

In the present invention, it is preferable for the chip parts of passive elements that are connected to the bus line to be mounted on the first or second conductive layer. By this means, it is possible to produce a noise filter circuit configuration whereby noise on the bus line is eliminated and to further reduce the effects of noise generated by the bus line.

In the present invention, it is preferable for one of the first and second semiconductor IC chips to be a controller IC and for the other to be a memory IC. The bus line that connects the controller IC and the memory IC operates at a high clock speed, and as the wiring distance increases, the high-frequency waves generate unwanted radiation, which has a significant effect on the other circuits.

In the present invention, it is preferable for at least one layer selected from the first and second insulating layers to have a ferromagnetic material as a component. By this means, the bus, line that connects with the insulating layer having ferromagnetic material will be equivalent to a series circuit having a damping resistor and a bead, so spurious effects can be additionally suppressed, and noise generated by the bus line can be additionally decreased.

In the present invention, it is preferable for the first and second semiconductor IC chips and the bus line to be substantially directly connected via a conductive projection. By this means, the impedance control of the bus line is facilitated, and analog-digital interference can be minimized by providing a shielding means or laying the wires so that the bus lines of other neighboring systems are not parallel to each other.

In the present invention, it is preferable for all signal lines that constitute the bus line to be provided in the first wiring layer, but part of a signal line that constitutes the bus line and intersects with at least another signal line may be formed in a second wiring layer that is different from the first wiring layer. Even with the presence of this type of via-hole electrodes, the separation of the via-hole electrodes is not particularly close.

It is therefore believed that the effect of noise due to the via-hole electrodes is extremely small in comparison to cases in which many of the signal lines that are components of a bus line are configured using via-hole electrodes.

In the present invention, it is preferable that a plurality of via-hole electrodes for connecting the first and second conductive layers be disposed at least at the periphery of the bus line, and particularly between the bus line and an analog region. By this means, noise generated by the bus line or the like and transmitted horizontally along the substrate will be shielded, the ground connection will be strengthened, and interference due to the bus line or the like can thereby be minimized.

It is preferable that the present invention comprise an analog region provided inside the multilayer substrate, a third conductive layer that is provided in the same layer as the first conductive layer and covers the top of the analog region, and a fourth conductive layer that is provided in the same layer as the second conductive layer and covers the bottom of the analog region, wherein the first and second conductive layers and the third and fourth conductive layers are be formed separately. By this means, transmission of noise from the bus line or the like to the analog side via the ground layer will not occur, and interference caused by the bus line or the like can be additionally suppressed.

According to the present invention, the top and bottom of a bus line that connects first and second semiconductor ICs are covered with a ground layer, allowing a reduction in noise generated by the bus line. In addition, the first and second semiconductor ICs are not layered vertically, but are disposed in a mutually horizontal configuration, thereby allowing the ICs to be directly connected without using via-hole electrodes as interlayer connection means. Consequently, it is possible to dispose the bus lines over minimum distances, to reduce noise generated by the bus lines, and to thereby reduce the size and thickness of the semiconductor IC-embedded module.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 3 is a diagram showing another example of the wiring layout of a bus line 104X, where

FIG. 9 is a diagram showing the structure of the semiconductor IC-embedded module according to a sixth embodiment of the present invention, where FIG. 10 is a diagram showing the structure of the semiconductor IC-embedded module according to a seventh embodiment of the present invention, where

DESCRIPTION OF THE PREFERRED EMBODIMENTS

Preferred embodiments of the present invention will now be described in detail hereinafter with reference to the accompanying drawings.

Figure 1:
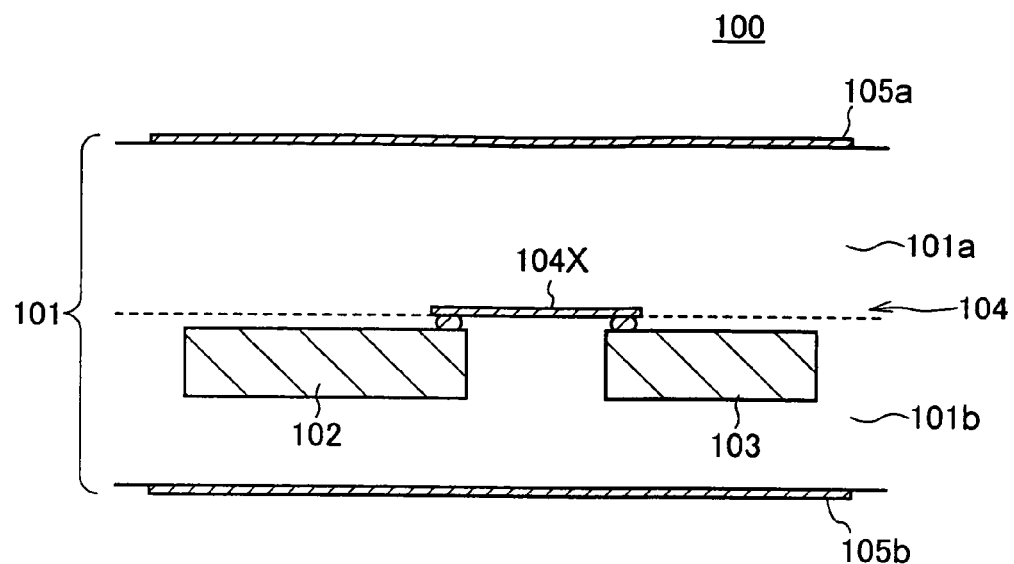
FIG. 1 is a schematic cross-sectional view showing the structure of the semiconductor IC-embedded module according to a first embodiment of the present invention.
Figure 2:
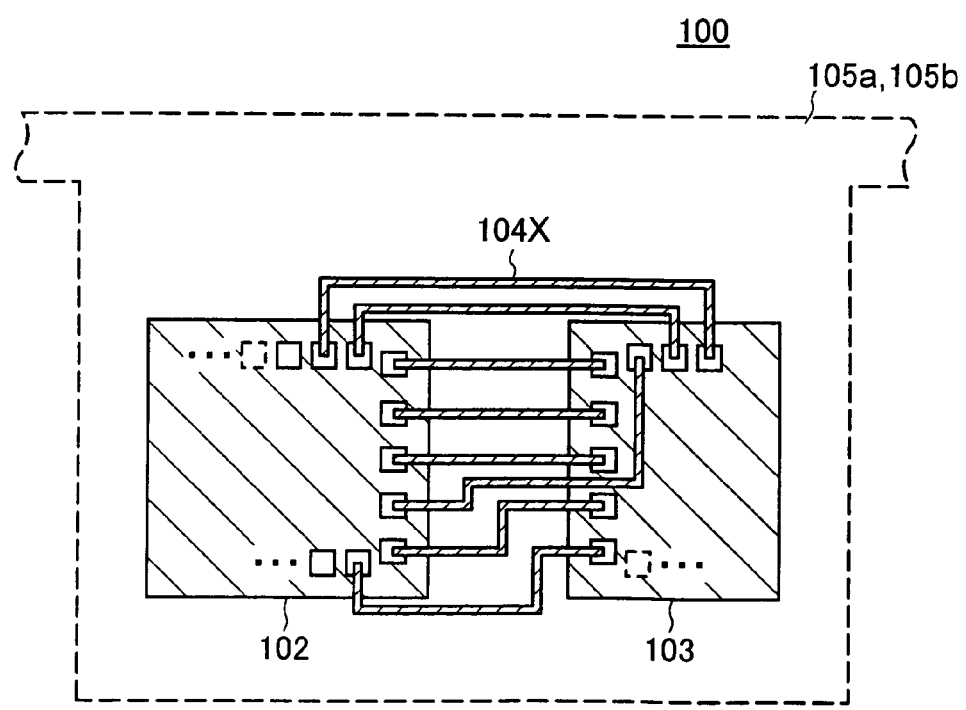
FIG. 2 is a schematic plan view showing the structure of the semiconductor IC-embedded module according to a first embodiment of the present invention.

FIG. 1 is a schematic cross-sectional view showing the structure of the semiconductor IC-embedded module according to a first embodiment of the present invention. FIG. 2 is a schematic plan view showing the structure of this semiconductor IC-embedded module.

As shown in FIGS. 1 and 2, the semiconductor IC-embedded module 100 has a multilayer substrate 101, and a controller IC 102 and memory IC 103 embedded in the multilayer substrate 101. The multilayer substrate 101 in the present embodiment has a first insulating layer 101a and a second insulating layer 101b, and the controller IC 102 and memory IC 103 are embedded as bare chips in the second insulating layer 101b. A wiring layer 104 is provided as an interlayer between the first and second insulating layers 101a and 101b (i.e., an interlayer of the multilayer substrate 101), and part of the wiring layer 104 constitutes a bus line 104X that connects the controller IC 102 and memory IC 103.

Connections between the bus line 104X and the pad electrodes on the bare chip are made using conductive protrusions such as bumps, rather than by means of via-hole electrodes, i.e., in a substantially direct manner. This is done because impedance suppression is difficult when the bus line is configured using via holes, and more noise is likely to be generated. In addition, when a controller IC has a combination of digital circuits and analog circuits; e.g., if the controller IC and bus line are connected by a via-hole electrode, then the via-hole electrodes that are components of respective signal lines are laid in parallel near each other, which leads to problems with interference on analog signal lines caused by the digital signal lines. However, when these semiconductor IC pad electrodes and bus lines are connected in a substantially direct manner, the impedance control of the bus line is facilitated, and it is thus possible to minimize analog-digital interference by disposing a shielding means or by laying wires so that adjacent bus line are not parallel to each other.

The first and second ground layers 105a and 105b are respectively provided as surface layers for the first and second insulating layers 101a and 101b (i.e., the outer layers of the multilayer substrate 101). In other words, the first ground layer 105a is provided on the surface of the first insulating layer 101a on the side opposite the second insulating layer 101b, and the second ground layer 105b is provided on the surface of the second insulating layer 101b on the side opposite the first insulating layer 101a. By this means, the top and bottom of the bus line 104X are covered with the first and second ground layers 105a and 105b, respectively.

The bus line 104X is a signal line that transmits high-voltage digital signals at, for example, 5 V or 3.3 V using a high clock speed of 100 MHz. The high-frequency noise generated by the bus line 104X has detrimental effects on wireless analog circuits, and, for example, decreases receiver sensitivity in hand-held telephones. These effects are increased as bus line length increases. However, in accordance with the semiconductor IC-embedded module 100 of the present embodiment, the ground layers 105a and 105b are formed on both surfaces of the multilayer substrate 101, and thus the top and bottom of the bus line 104X are covered by the first and second ground layers 105a and 105b, respectively. It is therefore possible to reduce the effects of noise generated by the bus line 104X due to the shielding effect of the ground layers 105a and 105b. In order to increase the shielding effect, it is preferable for the ground layers 105a and 105b to cover as broad an area as possible at the periphery of the bus line 104X.

In the present invention, the controller IC 102 and memory IC 103 are disposed in a configuration whereby these ICs are mutually horizontal, and the terminals of these semiconductor ICs are directly connected by the bus line 104X. When semiconductor IC chips are layered vertically as in the prior art, it is necessary to use via holes as the interlayer connection means for parts of the bus lines that connect the semiconductor ICs, and thus a large amount of space is required for the bus line region, making it difficult to control bus line impedance. In addition, the effects of high-frequency noise are increased because of the long wiring distance of the bus lines. In the present embodiment, however, it is not necessary to use via-hole electrodes as parts of the bus lines, which makes it possible to minimize the wiring distances in the bus line 104X, as shown in FIG. 2, and to reduce noise generated by the bus line 104X.

Figure 3A:
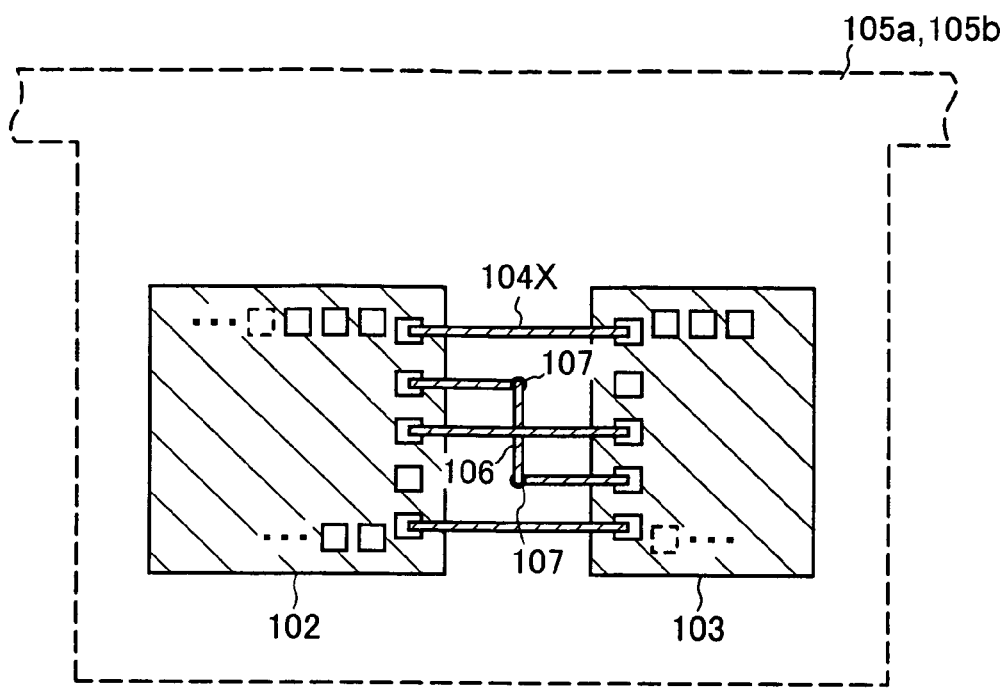
FIG. 3A is a schematic plan view and FIG. 3B is a schematic cross-sectional view.
Figure 3B:
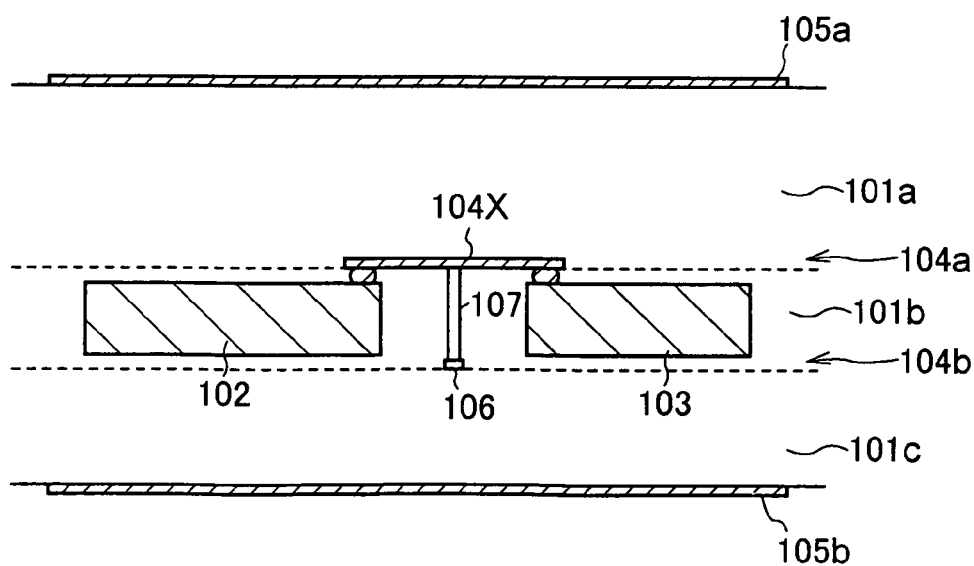

As shown in FIG. 1, the bus line is preferably configured as a single layer without passing through other wiring layers. In cases where efficient wiring is not possible unless a signal line present in the bus line intersects with another signal line, then, for example, part of this bus line 104x may be formed in the second wiring layer 104b, including the region 106 where an intersection is formed with the other signal line, as shown in FIGS. 3A and 3B. In this case, a via-hole electrode 107 is necessary, but because a large number of the signal lines that constitute the bus line 104x are formed in the first wiring layer 104a, and because connections are made using pad electrodes rather than via-hole electrodes, the separation between the via-hole electrodes 107 is not very close, which is thought to dramatically reduce the effects of noise resulting from the via-hole electrodes 107.

In the first embodiment described above, a configuration is produced in which a so-called three-layer substrate is used as the multilayer substrate, the internal-layer bus line 104X is sandwiched by the ground layers 105a and 105b provided as the outer layers of the multilayer substrate 101, and the top and bottom of the bus line 104X are covered by the ground layers 105a and 105b. However, a substrate with a multilayer structure may also be used in the present invention, and a ground layer may be provided as an internal layer of the multilayer substrate.

Figure 4:
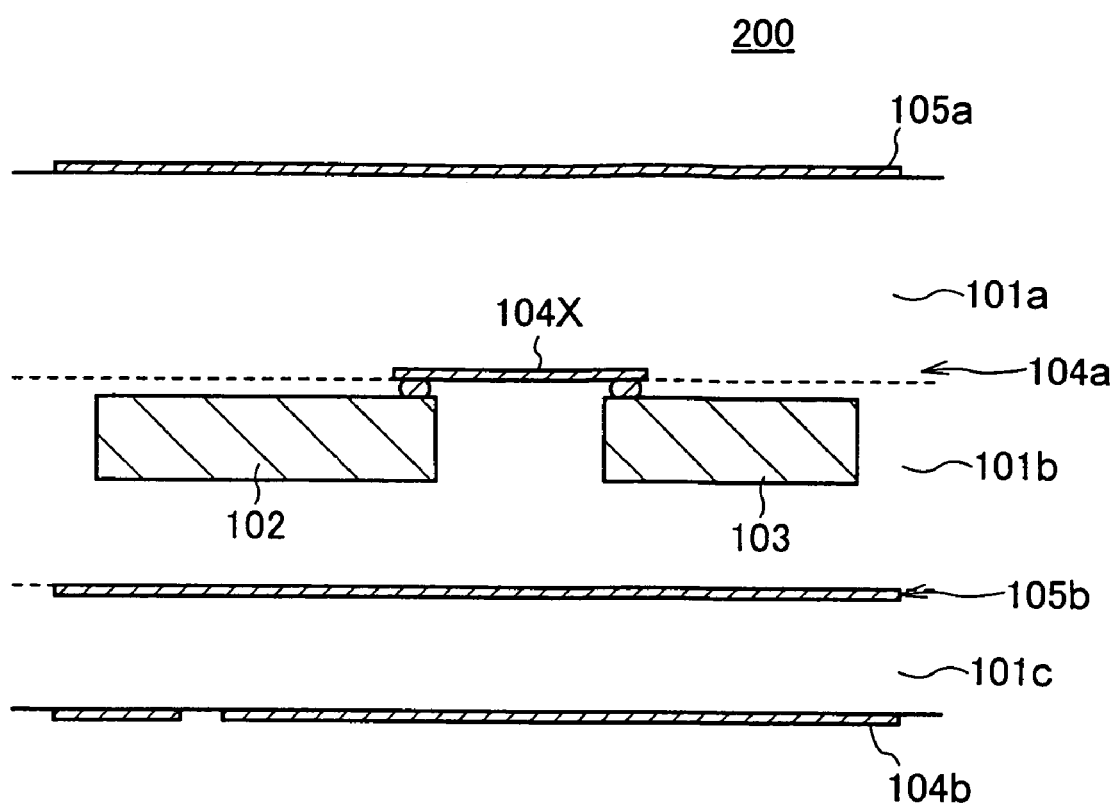
FIG. 4 is a schematic cross-sectional view showing the structure of the semiconductor IC-embedded module according to a second embodiment of the present invention.

FIG. 4 is a schematic cross-sectional view showing the structure of the semiconductor IC-embedded module according to a second embodiment of the present invention.

As shown in FIG. 4, the characteristics of this semiconductor IC-embedded module 200 are that the multilayer substrate 101 has a first insulating layer 101a, a second insulating layer 101b, and a third insulating layer 101c, that the first ground layer 105a is provided on the surface layer of the insulating layer 101a (i.e., the outer layer of the multilayer substrate 101), and that the second ground layer 105b is provided as an interlayer between the second insulating layer 101b and third insulating layer 101c (i.e., as an internal layer of the multilayer substrate 101). The first wiring layer 104a is provided as an interlayer between the first and second insulating layers 101a and 101b, and the second wiring layer 104b is provided on the surface layer of the third insulating layer 101c. Part of the first wiring layer 104a constitutes the bus line 104X, and the controller IC 102 and memory IC 103 are connected by the bus line 104X. The controller IC 102 and memory IC 103 are embedded as a bare chip in the second insulating layer 101b, and are connected to the bus line 104X using pad electrodes or other conductive protrusions on the bare chip.

Thus, with the semiconductor IC-embedded module 200 of the present embodiment, a four-layer substrate is used as the multilayer substrate 101, the bus line 104x is sandwiched using a ground layer 105a provided as an outer layer of the multilayer substrate 101 and a ground layer 105b provided as an inner layer, and similar effects as in the first embodiment can be obtained because the top and bottom of the bus line 104X are covered with the ground layers. In the present embodiment, a case was described in which one of the top and bottom ground layers was provided as an internal layer of the multilayer substrate, but a multilayer structure with 5 or more layers may also be used as the multilayer substrate, and the upper and lower ground layers may both be formed as internal layers of the multilayer substrate 101.

Figure 5:
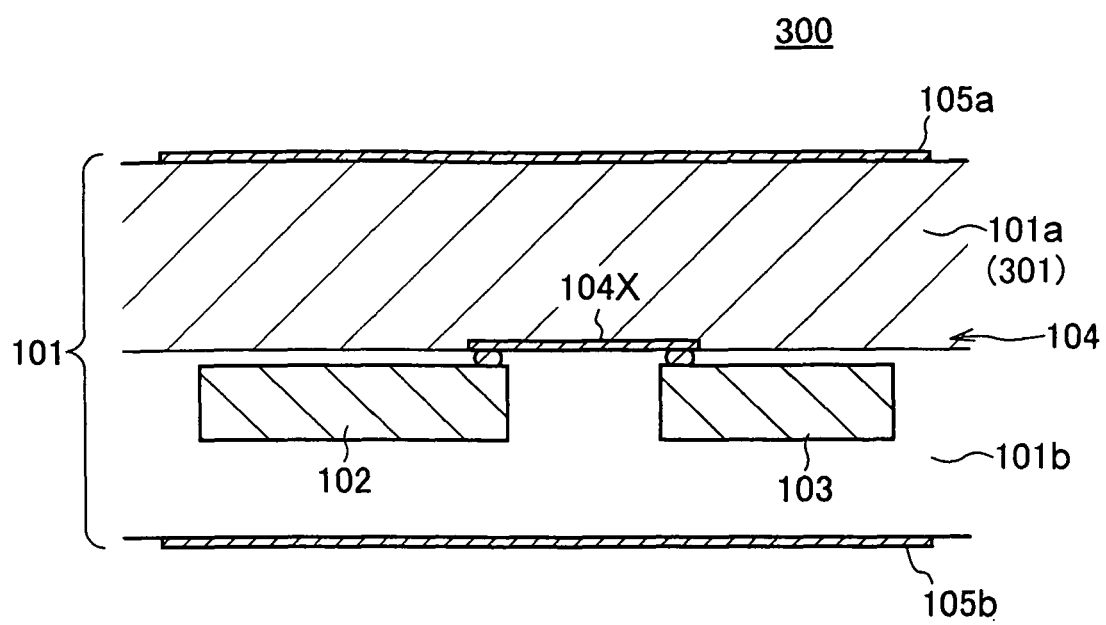
FIG. 5 is a schematic cross-sectional view showing the structure of the semiconductor IC-embedded module according to a third embodiment of the present invention.

FIG. 5 is a schematic cross-sectional view showing the structure of the semiconductor IC-embedded module according to a third embodiment of the present invention.

As shown in FIG. 5, a characteristic of this semiconductor IC-embedded module 300 is that the first insulating layer 101a that constitutes the multilayer substrate 101 has a configuration that includes a ferromagnetic material. Examples of ferromagnetic materials include ferrite and ferromagnetic metals. Examples of preferred ferrites include those based on Mn—Mg—Zn, Ni—Zn, and Mn—Zn. In addition, examples of preferred ferromagnetic metals include carbonyl iron, iron-silicon alloys, iron-aluminum-silicon alloys (Sendust (trade name)), iron-nickel alloys (Permalloy (trade name)), iron-based amorphous materials, and cobalt-based amorphous materials. By using resin in which this type of ferrite filler or ferromagnetic metal powder has been admixed, the first insulating layer 101a can be configured as a ferromagnetic layer 301. The rest of the configuration is similar to that of the first embodiment. Therefore, the same reference symbols are used for the same constituent elements, and their descriptions are omitted.

Figure 6:
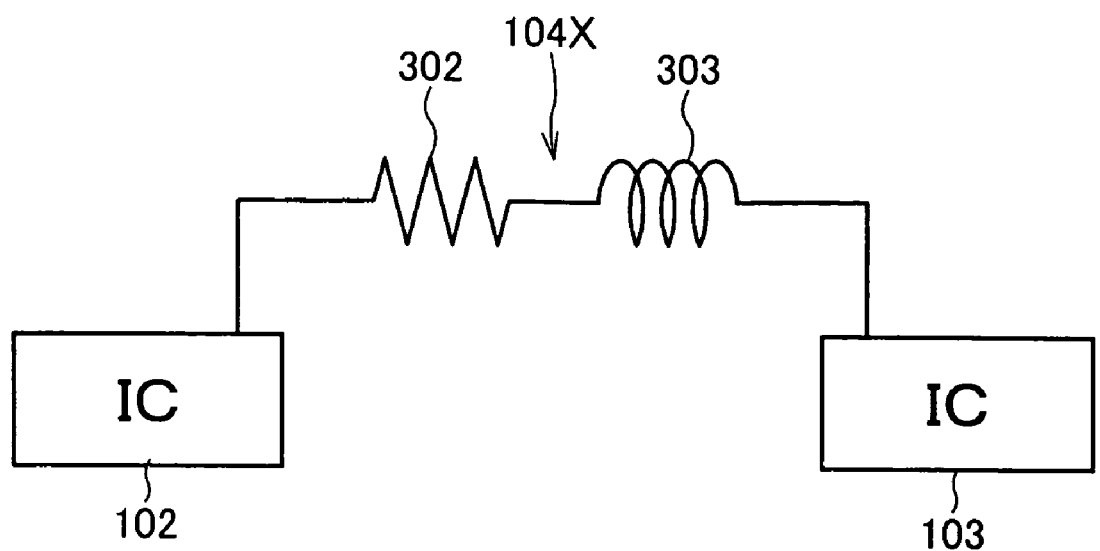
FIG. 6 is a circuit diagram that schematically portrays an equivalent circuit for the bus line 104X.

According to the semiconductor IC-embedded module 300 of the present embodiment, it is possible to obtain the same effects as in the first embodiment. Moreover, the equivalent circuit of the bus line 104X that is in contact with the magnetic layer 301 is a series circuit consisting of a damping resistor 302 and a bead 303, as shown in FIG. 6. Consequently, spurious effects can be additionally suppressed, and additional reduction in noise generated by the bus line 104X is possible.

In the present embodiment, a case was described in which the first insulating layer 101a is configured as a magnetic layer 201, but the present invention is not restricted to the present embodiment. The second insulating layer 101b can also be configured as a magnetic layer, and both the first and second insulating layers 101a and 101b can be configured as magnetic layers. In other words, at least one layer selected from the first and second insulating layers 101a and 101b that are components of the multilayer substrate 101 may be configured as a magnetic layer.

Figure 7:
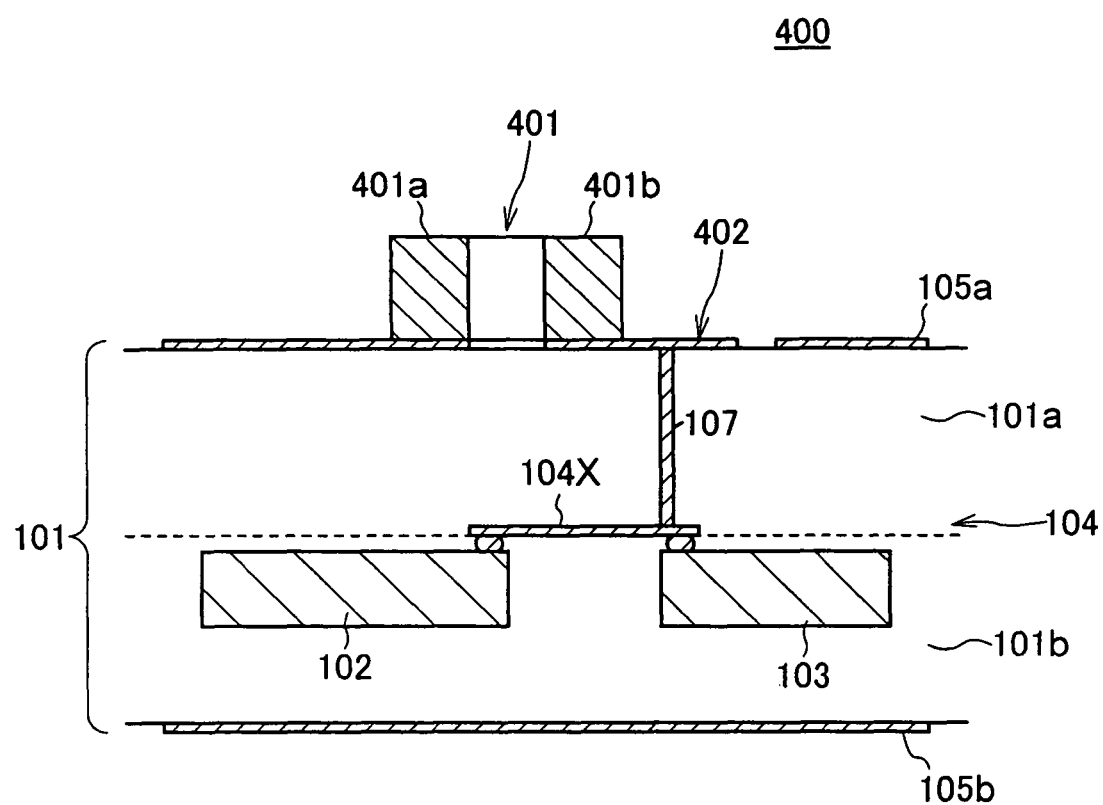
FIG. 7 is a schematic cross-sectional view showing the structure of the semiconductor IC-embedded module according to a fourth embodiment of the present invention.

FIG. 7 is a schematic cross-sectional view showing the configuration of the semiconductor IC-embedded module according to a fourth embodiment of the present invention.

As shown in FIG. 7, the characteristics of this semiconductor IC-embedded module 400 are that chip parts 401 of passive elements such as R, L, and C components are mounted on the surface of the multilayer substrate 101, and these passive elements constitute a noise filter circuit that eliminates noise on the bus line 104X. Ground layers 105a and 105b are formed on the surface of the multilayer substrate 101, and the peripheral conductor is therefore cut away over a prescribed region to form a land pattern 402. This land pattern 402 and bus line 104X are connected with a via-hole electrode 403. One of the electrodes 401a of the chip part 401 is then connected to the ground layer 105a, and the other electrode 401b is connected to the land pattern 402. The rest of the configuration is similar to that of the first embodiment. Therefore, the same reference symbols are used for the same constituent elements, and their descriptions are omitted.

In accordance with the semiconductor IC-embedded module 400 of the present embodiment, R, L, and C components and composite parts thereof are mounted on the multilayer substrate 101. As a result, not only are the same effects as in the first embodiment obtained, but the effects of noise generated by the bus line can be further reduced.

Figure 8:
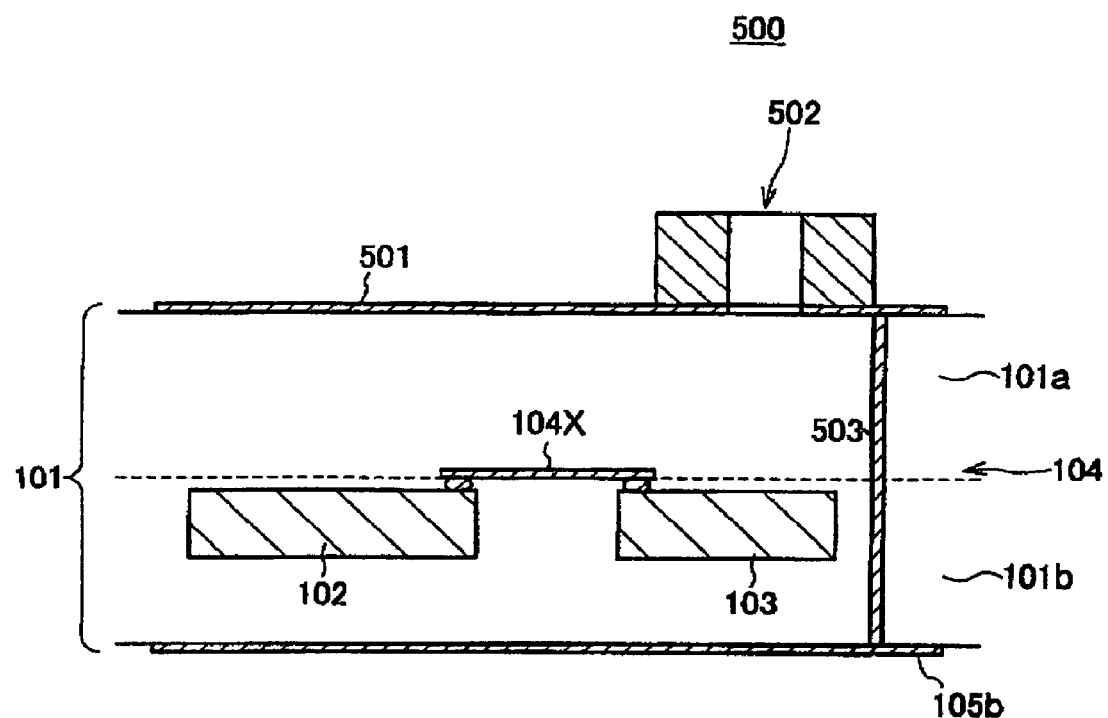
FIG. 8 is a schematic cross-sectional view showing the structure of the semiconductor IC-embedded module according to a fifth embodiment of the present invention.

FIG. 8 is a schematic cross-sectional view showing the structure of the semiconductor IC-embedded module according to a fifth embodiment of the present invention.

As shown in FIG. 8, the characteristics of the semiconductor IC-embedded module 500 are that the bus line and semiconductor ICs are not sandwiched with two ground layers, but rather one of the conductive layers formed on the two surfaces of the multilayer substrate 101 is used as a power layer 501 and the other is used as the ground layer 105b, and that the bus line and semiconductor ICs are sandwiched by the power layer 501 and the ground layer 105b. The rest of the configuration is similar to that of the first embodiment. Therefore, the same reference symbols are used for the same constituent elements, and their descriptions are omitted. Because DC power is supplied to the power layer 501, connecting the power layer 501 and ground layer 105b by a high-capacity bypass capacitor 502 and a via-hole electrode 503, allows the power layer 501 to be viewed as a ground layer in terms of alternating current. Consequently, effects that are similar to those of the first embodiment can be obtained by the semiconductor IC-embedded module 500 of the present embodiment.

Figure 9A:
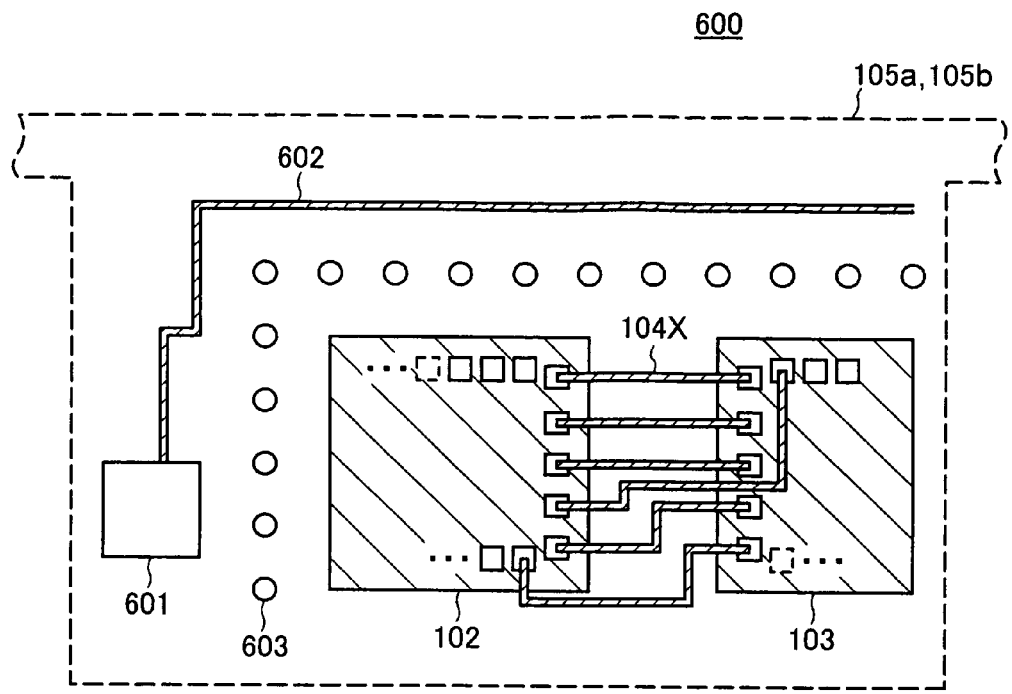
FIG. 9A is a schematic plan view and FIG. 9B is a schematic cross-sectional view.
Figure 9B:
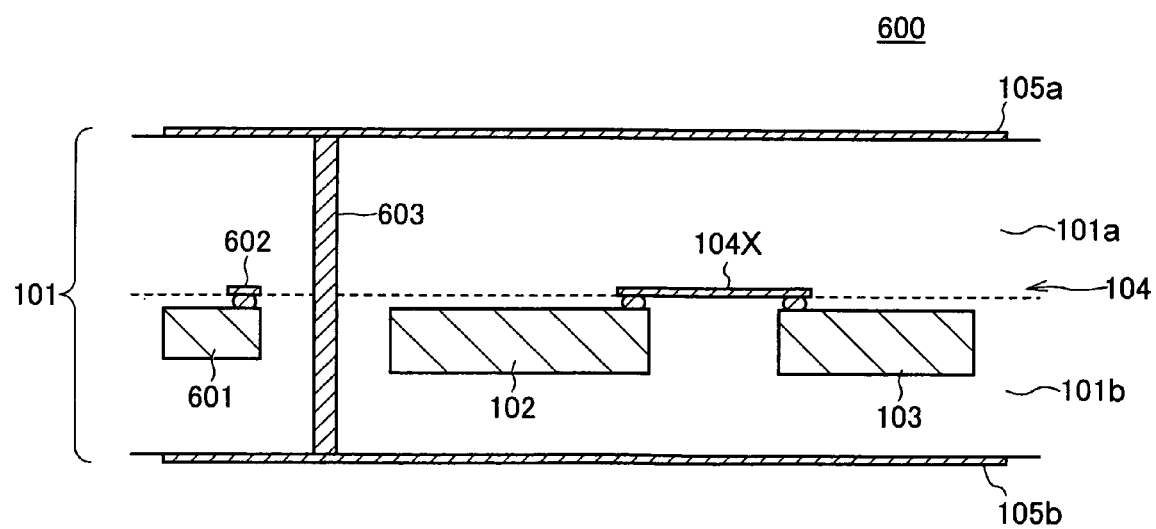

FIGS. 9A and 9B are diagrams showing the structure of the semiconductor IC-embedded module according to a sixth embodiment of the present invention. FIG. 9A is a schematic plan view, and FIG. 9B is a schematic cross-sectional view.

AS shown in FIGS. 9A and 9B, the characteristics of the semiconductor IC-embedded module 600 are that the tops and bottoms of the bus line and semiconductor ICs are sandwiched by the first and second ground layers 105A and 105B, and that a plurality of via-hole electrodes 603 that connect the upper and lower ground layers 105a and 105b are disposed at the periphery of the bus line 104X and the semiconductor ICs 102 and 103, e.g., in the region between the bus line 104X and the region in which analog circuits 601 or analog signal lines 602 are formed so as not to be affected by the bus line 104X (analog region). The rest of the configuration is similar to that of the first embodiment. Therefore, the same reference symbols are used for the same constituent elements, and their descriptions are omitted. The same effects as in the first embodiment can be obtained when this type of configuration is used. In addition, noise that is generated by the bus line 104X or the like and is transmitted horizontally along the substrate is blocked by means of the arrangement of the via-hole electrodes 603, and interference due to the bus line 104X or the like can therefore be minimized.

Figure 10A:
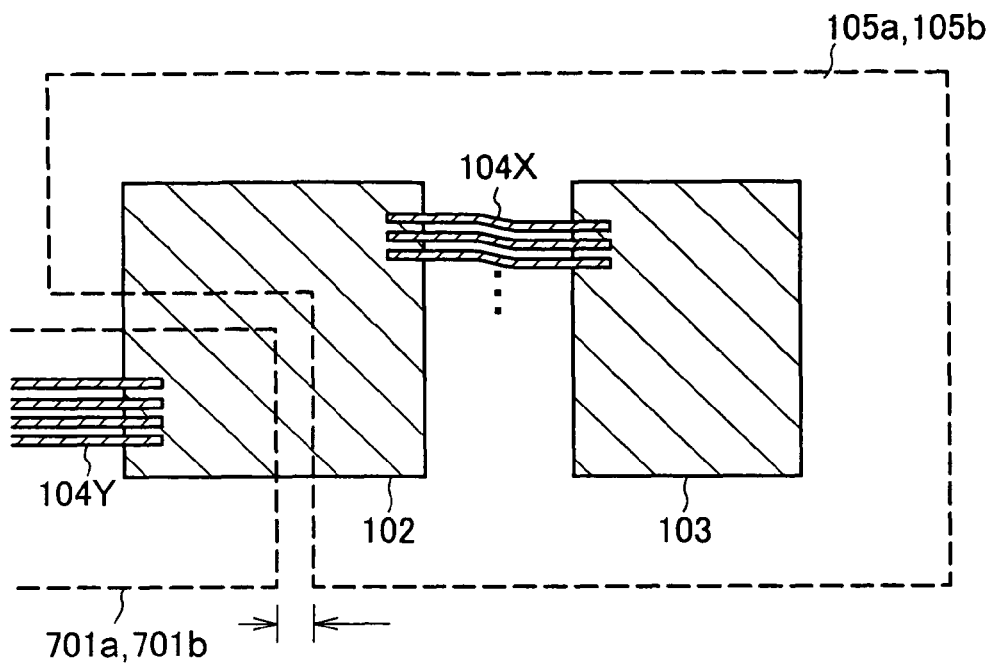
FIG. 10A is a schematic plan view and FIG. 10B is a schematic cross-sectional view.
Figure 10B:
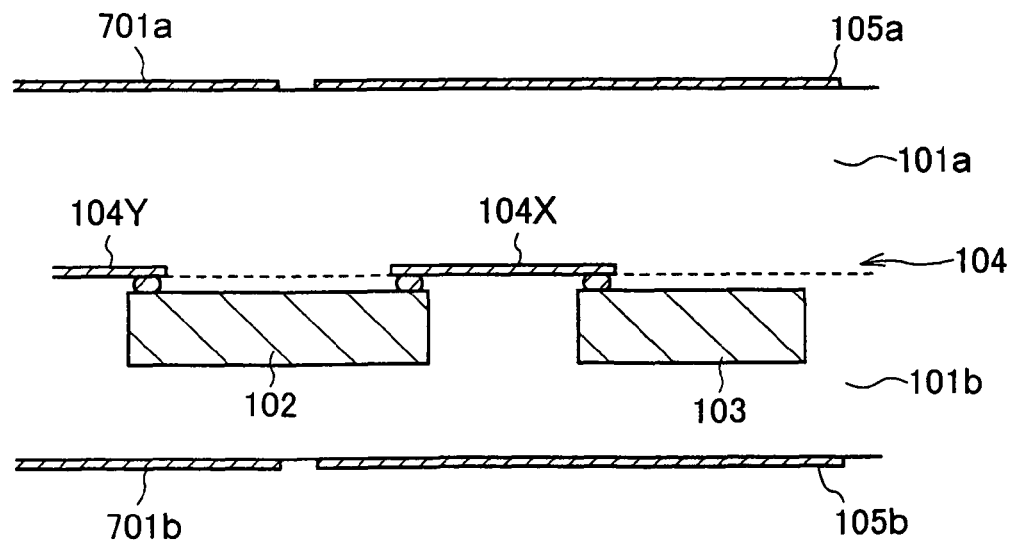

FIG. 10 is a schematic cross-sectional view showing the structure of the semiconductor IC-embedded module according to a seventh embodiment of the present invention.

As shown in FIG. 10, the characteristics of the semiconductor IC-embedded module 700 are that first and second ground layers 105a and 105b that cover the region (digital region) provided with the digital parts or the like of the controller IC 102 and the bus line 104X are formed in the multilayer substrate 101, and that third and fourth ground layers 701a and 701b that cover the top and bottom of the region (analog region) in which the analog signal line 104Y and the analog parts of the controller IC 102 are formed in the substrate. The analog region is not restricted to the analog parts of the controller IC 102, and includes regions in which other analog circuits are formed. The third ground layer 701a is formed at a distance from each other in the same layer as the ground layer 105a, and the fourth ground layer 702b is formed at a distance from each other in the same layer as the first ground layer 105b. When the ground layers that cover the digital region, and the ground layers that cover the analog regions 701a and 701b in the multilayer substrate 101 are formed in the same layer at a distance from each other in this manner, noise that is generated from the bus line or the like is not transmitted to the analog side via the ground layer, and interference from the bus line or the like can be suppressed.

The present invention is not restricted to the above embodiments, and various modifications are possible that do not depart from the spirit of the invention. These modifications are also within the scope of the present invention.

For example, the above embodiments describe a case in which the first and second insulating layers are components of the multilayer substrate, but the present invention is not restricted to this configuration, and is applicable to multilayer substrates having three or more insulating layers as components. However, it is preferable for the analog wiring layer to be interposed between the ground layer and the bus line.

In the above embodiments, the controller IC 102 and memory IC 103 were cited as examples of semiconductor IC chips that are embedded in the multilayer substrate, but the present invention is not restricted to this configuration. A semiconductor IC having any use may be employed, provided that a bus line is used as an input-output interface.

In addition, a case is described in the above embodiments in which the controller IC 102 and memory IC 103 are both embedded in a second insulating layer 101b. However, the present invention is not restricted to this configuration, and, for example, the controller IC may be embedded in the first insulating layer 101a, and the memory IC may be embedded in the second insulating layer 101b. In this case as well, the bus line that connects the controller IC and the memory IC can be formed in the wiring layer between the first insulating layer 101a and the second insulating layer 101b, and the use of via-hole electrodes is not necessary.

What is claimed is:
1. A semiconductor IC-embedded module comprising:
a multilayer substrate on which a plurality of insulating layers are layered;
first and second semiconductor IC chips implanted into the multilayer substrate so as to he arranged in a mutually horizontal configuration;
a plurality of bus lines directly connecting the first semiconductor IC chip to the second semiconductor IC chip;
a first conductive layer that completely covers at least an area approximately directly above the entire bus line; and a second conductive layer that completely covers at least an area approximately directly below the entire bus line.

2. The semiconductor IC-embedded module as claimed in claim 1, wherein
the multilayer substrate has first and second insulating layers, and a first wiring layer disposed between the first and second insulating layers; and
the bus line is disposed in the first wiring layer.

3. The semiconductor IC-embedded module as claimed in claim 2, wherein
both the first and second semiconductor IC chips are embedded in one layer selected from the first and second insulating layers.

4. The semiconductor IC-embedded module as claimed in claim 2, wherein
the first conductive layer is provided on the surface of the first insulating layer on the side opposite the second insulating layer, and
the second conductive layer is provided on the surface of the second insulating layer on the side opposite the first insulating layer.

5. The semiconductor IC-embedded module as claimed in claim 1, wherein
one layer selected from the first and second conductive layers is a power layer,
the other is a ground layer, and
a bypass capacitor is provided having a first terminal connected to the power layer and having a second terminal connected to the ground layer.

6. The semiconductor IC-embedded module as claimed in claim 1, wherein
the chip parts of passive elements that are connected to the bus line are mounted on the first or second conductive layer.

7. The semiconductor IC-embedded module as claimed in claim 1, wherein
one component selected from the first and second semiconductor IC chips is a controller IC, and the other is a memory IC.

8. The semiconductor IC-embedded module as claimed in claim 3, wherein
at least one layer selected from the first and second insulating layers has a ferromagnetic material as a component.

9. The semiconductor IC-embedded module as claimed in claim 2, wherein
the first and second semiconductor IC chips and the bus line are connected by a conductive protrusion in a substantially direct manner.

10. The semiconductor IC-embedded module as claimed in claim 2, wherein
part of a signal line that constitutes the bus line and intersects with at least another signal line is provided in a second wiring layer that is different from the first wiring layer.

11. The semiconductor IC-embedded module as claimed in claim 1, wherein
a plurality of via-hole electrodes for connecting the first and second conductive layers are disposed at least at the periphery of the bus line.

12. The semiconductor IC-embedded module as claimed in claim 11, wherein
the via-hole electrodes are disposed between the bus line and the analog region.

13. The semiconductor IC-embedded module as claimed in claim 1, further comprising:
an analog region provided in the multilayer substrate,
a third conductive layer that is provided in the same layer as the first conductive layer and covers the top of the analog region, and
a fourth conductive layer that is provided in the same layer as the second conductive layer and covers the top and bottom of the analog region; and wherein
the first and second conductive layers and the third and fourth conductive layers are formed at a distance from each other.

14. A semiconductor IC-embedded module comprising:
a multilayer substrate on which a plurality of insulating layers are layered;
a first semiconductor IC chip and a second semiconductor IC chip formed within the multilayer substrate so as to he arranged in a mutually horizontal configuration;
one or more conductive line(s) connecting the first semiconductor IC chip to the second semiconductor IC chip;
a first conductive layer that is insulated from and completely covers at least an area approximately directly above the entire one or more conductive line(s); and
a second conductive layer that is insulated from and completely covers at least an area approximately directly below the entire one or more conductive line(s), wherein the first conductive layer and second conductive layer act to electrically shield at least approximately an entire top or bottom of the one or more conductive line(s) so as to reduce interference caused by noise generated by the one or more conductive line(s).

15. The semiconductor IC-embedded module as claimed in claim 14, wherein
the first semiconductor IC chip is a controller IC, the second semiconductor IC chip is a memory IC and the one or more conductive line(s) include a communication bus containing a plurality of conductive lines that carry digital data shared between the controller IC and the memory IC.

16. A semiconductor IC-embedded module comprising:
a multilayer substrate on which a plurality of insulating layers are layered;
a first semiconductor IC chip and a second semiconductor IC chip formed within the multilayer substrate so as to be arranged in a mutually horizontal configuration;
one or more conductive line(s) formed in approximately the same plane between at least two of the plurality of insulating layers and connecting the first semiconductor IC chip to the second semiconductor IC chip so as to enable electrical connection between them without using any via hole conductive line(s) to connect the first semiconductor IC chip to the second semiconductor IC chip;
a first conductive layer that is insulated from and completely covers at least an area approximately directly above the one or more conductive line(s);
a second conductive layer that is insulated from and completely covers at least an area approximately directly below the one or more conductive line(s); and
a plurality of via-hole electrodes connecting the first and second conductive layers are disposed at least at the periphery of the one or more conductive line(s) so as to act to electrically shield signal(s) on the one or more conductive line(s) from interfering with other circuits located in areas away from the location of the one or more conductive line(s).

17. The semiconductor IC-embedded module as claimed in claim 16, wherein
the first semiconductor IC chip and a second semiconductor IC chip are digital devices and the via-hole electrodes are disposed between the one or more conductive line(s) and an analog device region.

18. A method of forming a semiconductor IC-embedded module, comprising the steps of:

forming a multilayer substrate including a plurality of layered insulating layers;

forming a first semiconductor IC chip and second semiconductor IC chip in the multilayer substrate so that they are arranged in a mutually horizontal configuration;

forming a bus line directly connecting the first semiconductor IC chip and the second semiconductor IC chip, wherein the first semiconductor IC chip, the second semiconductor IC chip, and the bus line are connected by conductive protrusions that protrude from one surface of the multilayer substrate;

forming a first conductive layer that completely covers at least an area approximately directly above the entire bus line; and forming a second conductive layer that completely covers at least an area approximately directly below the entire bus line.

19. A method of forming a semiconductor IC-embedded module as claimed in claim 18, wherein the first conductive layer covers at least an area approximately directly above where the entire bus line couples to the first semiconductor IC chip and at least an area approximately directly above where the entire bus line couples to the second semiconductor IC chip, and the second conductive layer covers at least an area approximately directly below where the entire bus line couples to the first semiconductor IC chip and at least an area approximately directly below where the entire bus line couples to the second semiconductor IC chip, so as to provide embedded IC's and interconnecting bus line(s) that are sandwiched between the first conductive layer and the second conductive layer, at least on top of and below the entire interconnecting bus line(s) and at least the portion of the first semiconductor IC chip and the second semiconductor IC chip where the bus line(s) connect, thereby reducing the noise generated by the bus line.

20. The semiconductor IC-embedded module as claimed in claim 1, wherein the first conductive layer covers at least an area approximately directly above where the entire bus line couples to the first semiconductor IC chip and at least an area approximately directly above where the entire bus line couples to the second semiconductor IC chip, and the second conductive layer covers at least an area approximately directly below where the entire bus line couples to the first semiconductor IC chip and at least an area approximately directly below where the entire bus line couples to the second semiconductor IC chip, so as to provide embedded IC's and interconnecting bus line(s) that are sandwiched between the first conductive layer and the second conductive layer, at least on top of and below the entire interconnecting bus line(s) and at least the portion of the first semiconductor IC chip and the second semiconductor IC chip where the bus line(s) connect, thereby reducing the noise generated by the bus line.

* * * * *